United States Patent [19]

Kinoshita

[11] Patent Number: 4,675,849

[45] Date of Patent: Jun. 23, 1987

[54] SEMICONDUCTOR DEVICE

[75] Inventor: Tsuneo Kinoshita, Tokyo, Japan

[73] Assignee: Tokyo Shibaura Denki Kabushiki Kaisha, Kawasaki, Japan

[21] Appl. No.: 902,091

[22] Filed: Aug. 27, 1986

Related U.S. Application Data

[63] Continuation of Ser. No. 517,055, Jul. 25, 1983, abandoned.

[30] Foreign Application Priority Data

Jul. 26, 1982 [JP] Japan ............... 57/129806

[51] Int. Cl.⁴ .......................................... G11C 12/00
[52] U.S. Cl. .................... 365/230; 365/189; 365/200
[58] Field of Search ............ 365/200, 189, 230, 238; 307/465

[56] References Cited

U.S. PATENT DOCUMENTS

| | | | |
|---|---|---|---|
| 3,599,146 | 8/1971 | Weisbecker | 365/200 |
| 4,092,665 | 5/1978 | Saran | 365/230 |
| 4,092,728 | 5/1978 | Baltzer | 365/219 |
| 4,156,290 | 5/1979 | Lanza | 365/230 |
| 4,208,728 | 6/1980 | Blahut et al. | 307/465 |
| 4,348,737 | 9/1982 | Cukier et al. | 307/465 |
| 4,354,256 | 10/1982 | Miyasaka | 365/230 |
| 4,447,895 | 5/1984 | Asano et al. | 365/230 |

FOREIGN PATENT DOCUMENTS 55-78561  6/1980  Japan .
58-199539 11/1983 Japan .
1586230  3/1981 United Kingdom .

Primary Examiner—Terrell W. Fears
Attorney, Agent, or Firm—Cushman, Darby & Cushman

[57] ABSTRACT

A semiconductor device has an array section formed on a semiconductor chip. A memory section is also formed on the chip together with the array section. The memory section has a decoder for producing an address signal, memory blocks whose locations are commonly designated by the same address signal from the decoder, a selector controlling circuit for generating a control data designating at least one of the memory blocks, and a selector for selecting the designated block and for passing the input/output data to and from the selected block in accordance with the control data from the selector controlling circuit.

18 Claims, 5 Drawing Figures

SEMICONDUCTOR DEVICE

This is a continuation of application Ser. No. 517,055 filed Jul. 25, 1983 now abandoned.

BACKGROUND OF THE INVENTION

The present invention generally relates to a semiconductor device and, more particularly, to a semiconductor device formed as a gate array having a large number of logic cells on a chip.

This device offers great logic flexibility and is therefore receiving a lot of attention. A gate array is used for replacing IC packages on a circuit board with a single LSI circuit. A gate array generally has basic cells, i.e., NAND gates or NOR gates, which are regularly arranged on a chip. These gates may be connected to build any logic function. By interconnecting gates as flip-flops, adders, multiplexers, etc., these circuit elements can be placed in any combination anywhere on a chip. Thus, a circuit designer need only interconnect the gates with a dedicated metal pattern in order to form a custom-circuit logic function. Since various types of LSIs can be manufactured from gate arrays of the same specifications, utilization of gate arrays results in savings in development time and cost.

Conventionally, a custom-circuit LSI based on a gate array cannot have a large capacity memory. This is attributed to the following reason. Since memories such as general registers, floating registers or the like require many arrayed gates, the number of gates for forming circuit elements other than the memory becomes small. Furthermore, a memory obtained by a combination of arrayed gates has a slow operating speed.

SUMMARY OF THE INVENTION

It is an object of the present invention to provide a semiconductor device which has a memory effectively utilizing a limited area on a chip in addition to arrayed gates, and which allows selection of a bit × word configuration of this memory from a predetermined number of different combinations.

The above object of the present invention is achieved by a semiconductor device comprising: an array section and a memory section both formed on a single semiconductor chip, said memory section having a decoder for producing an address signal, a plurality of memory blocks whose locations are commonly designated by the same address signal from the decoder, a selector controlling circuit for generating control data for designating at least one block of said plurality of memory blocks, and a selector for selecting said at least one block of said plurality of memory blocks in accordance with the control data from said selector controlling circuit and for passing input/output data to and from said at least one block which is thus selected.

DETAILED DESCRIPTION OF THE PREFERRED EMBODIMENTS

Figure 1:
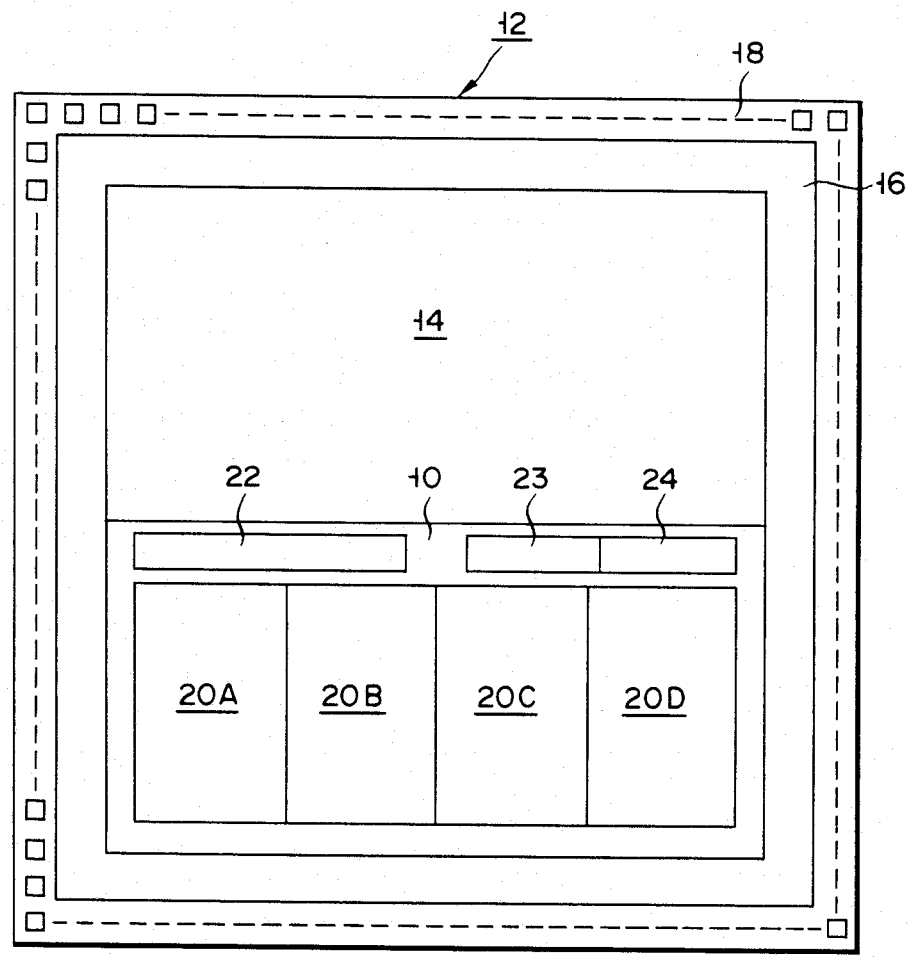
FIG. 1 shows a semiconductor device according to an embodiment of the present invention.

FIG. 1 shows a semiconductor device according to an embodiment of the present invention. The semiconductor device is one type of gate array having a memory section 10 on a chip 12. The device also has a conventional array section 14, input/output drivers 16, and bonding pads 18. The memory section 10 and the array section 14 each occupy about half of the entire area of the chip 12. The input/output drivers 16 and bonding pads 18 are arranged at the outer periphery of the chip 12. The array section 14 comprises a number of basic cells, e.g., NAND gates, which are regularly arranged in a matrix form. The basic cells have intervals with margins and may therefore be interconnected with a dedicated metal pattern to form a custom-circuit logic function. The memory section 10 has memory blocks 20A to 20D each having a number of memory cells, a decoder 22 for designating internal addresses of the respective memory blocks 20A to 20D, a selector controlling circuit 23 for designating at least one of the memory blocks 20A to 20D, and a selector 24 for selectively passing input/output data to and from the memory blocks 20A to 20D. The memory cells may comprise flip-flops or the like and can be of a highly integrated structure for memories.

Figure 2:
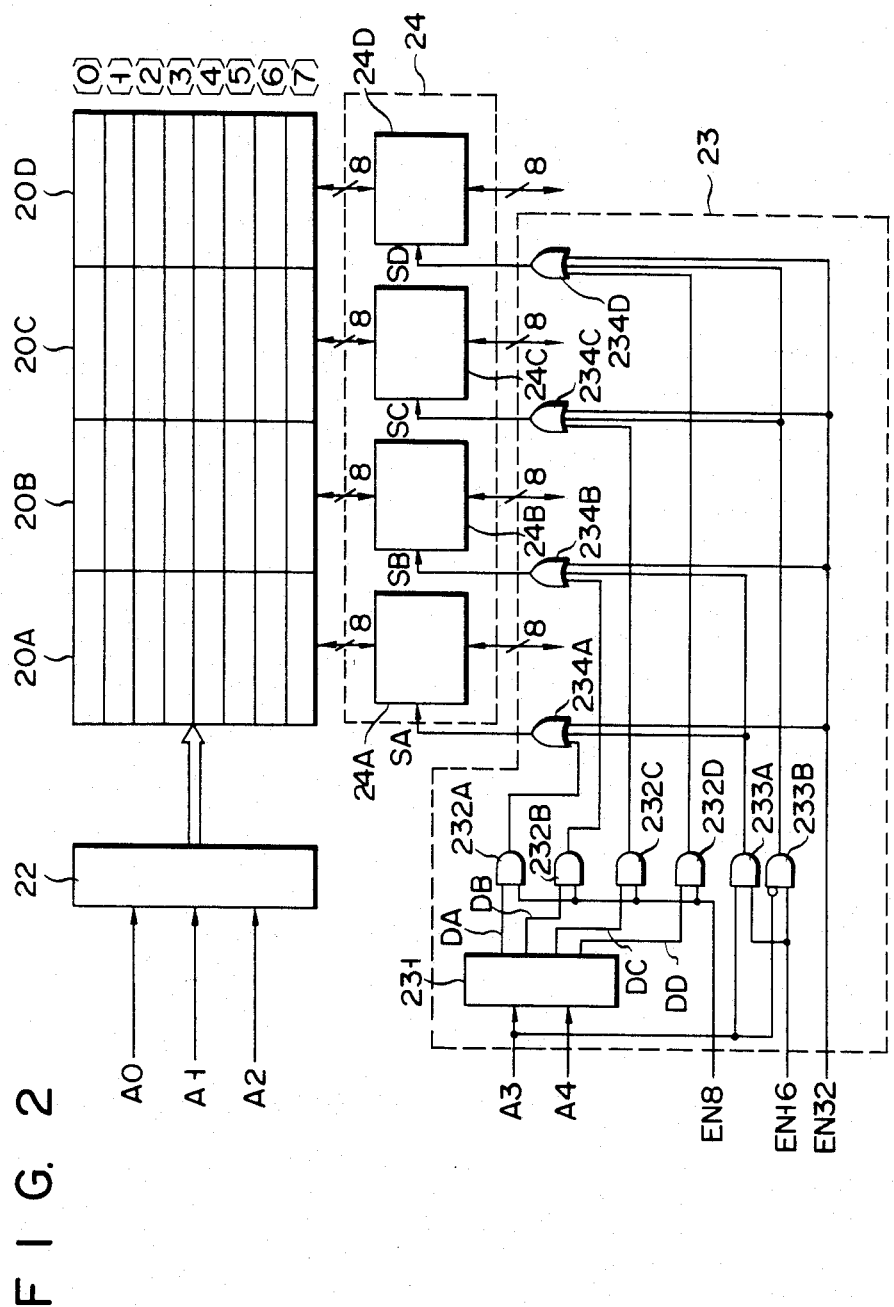
FIG. 2 shows circuits of a memory section of the semiconductor device shown in FIG. 1.

FIG. 2 shows circuits of the memory section 10. The memory cells in the respective memory blocks 20A to 20D are mutually connected to form an 8-bit×8-word memory. The word address is common to all the memory blocks 20A to 20D. The decoder 22 has input terminals to be connected to address lines A0 to A2, respectively, and also has output terminals connected to the request input terminals of the memory blocks 20A to 20D corresponding to the decoded address.

The selector controlling circuit 23 consists of a decoder 231 for generating decoding signals DA to DD corresponding to signals supplied from address lines A3 and A4, AND gates 232A to 232D for passing the decoding signals DA to DD in response to a control signal from an enable line EN8, AND gates 233A and 233B for passing the signal from the address line A3 in response to a control signal from an enable line EN16, and OR gates 234A to 234D for supplying select signals SA to SD in correspondence with output signals from the AND gates 232A to 232D and 233A and 233B and a control signal from an enable line EN32.

The decoder 231 has input terminals to be connected to the address lines A3 and A4. The output terminals of the decoder 231 are connected to the first input terminals of the corresponding OR gates through the AND gates 232A to 232D, respectively. The AND gates 232A to 232D have input terminals connected to the enable line EN8. The first input terminal of the AND gate 233A receives the signal from the address line A3. The first input terminal of the AND gate 233B receives the signal from the address line A3 through an inverter. Thus, the AND gate 233A and the AND gate 233B with the inverter serve as a 1-bit decoder. The second input terminals of the AND gates 233A and 233B are connected to the enable line EN16. The output terminal of the AND gate 233A is connected to the second input terminals of the OR gates 234A and 234B. The output terminal of the AND gate 233B is connected to the second input terminals of the OR gates 234C and 234D. The enable line EN32 is connected to the third input terminals of the OR gates 234A to 234D. The OR gates 234A to 234D respectively generate select signals SA, SB, SC and SD.

The selector 24 comprises four 8-bit 2-way gates 24A, 24B, 24C and 24D. The respective gates 24A to 24D have enable terminals and first and second 8-bit input/output ports, respectively. The first 8-bit input/output ports of the gates 24A to 24D are connected respectively connected to one of the memory blocks 20A to 20D, and the second 8-bit input/output ports can be connected to data lines. The enable terminals of the gates 24A to 24D are respectively connected to the output terminals of the OR gates 234A to 234D of the selector controlling circuit 23. The 2-way gates 24A to 24D pass input/output data to and from the respective memory blocks 20A to 20D in response to the select signals SA, SB, SC and SD supplied to their respective enable terminals.

In order to build a custom-circuit LSI, the address lines must be connected to the decoder 22 and to the selector controlling circuit 23, read/write control lines must be connected to memory blocks 20A to 20D, the data lines must be connected to the selector 24, the control signal from one of the enable lines EN8, EN16 and EN32 must be set at logic level "1" or "H", and the remaining control signals must be set at logic level "0" or "L".

In a read operation of data from the memory blocks 20A to 20D, for example, when a binary signal "11111" is supplied from the address lines A4 to A0 to the decoder 22 and the selector controlling circuit 23, the decoder 22 supplies an address signal obtained by decoding the three least significant bits to the memory blocks 20A to 20D. In response to this address signal, 8-bit data A, B, C and D are parallel-output from the locations of the memory blocks 20A to 20D corresponding to the designated address in the memory.

When the address lines A4 and A3 are (1,1), the decoder 231 of the selector controlling circuit 23 sets the decoding signal DA to logic level "H". Similarly, when the address lines A4 and A3 are (1,0), (0,1) and (0,0), the decoder 231 sets the decoding signals DB, DC and DD to logic level "H", respectively. Therefore, in this case (where A4, A3 = 1,1), only the AND gate 232A among the AND gates 232A to 232D whose input terminals are connected to the output terminals of the decoder 231 receives a decoding signal of logic level "H".

In this situation, when the control signal from the enable line EN8 alone is at logic level "H" and the control signals from the other enable lines are at logic level "L", a signal of logic level "H" is supplied from the AND gate 232A to the OR gate 234A, which supplies a select signal SA to the 2-way gate 24A of the selector 24. Then, the 2-way gate 24A passes the 8-bit data supplied to its first input/output port from its second input/output port to the data line. In this manner, one of the select signals SA to SD is selectively supplied to the 2-way gates 24A to 24D in correspondence with the signals supplied to the decoder 231 from the address lines A3 and A4. One of the data A, B, C and D from the memory blocks 20A to 20D which has an 8-bit word length is thus allowed to pass through the selector 24.

When the control signal from the enable line EN 16 alone is at logic level "H", the AND gate 233A supplies the signal from the address line A3 to the OR gates 234A and 234B, and the AND gate 233B supplies an inverted signal of the signal from the address line A3 to the OR gates 234C and 234D. Thus, when the signal from the address line A3 is at logic level "1", the OR gates 234A and 234B respectively supply the select signals SA and SB to the 2-way gates 24A and 24B of the selector 24. The 2-way gates 24A and 24B parallel-output the two 8-bit data portions A and B supplied to their respective first input/output ports onto the data lines from their respective second input/output ports. In correspondence with the signal from the address line A3 supplied to the AND gates 233A and 233B, the select signals SA and SB or SC and SD are selectively supplied from the OR gates 224A to 224D to the 2-way gates 24A to 24D of the selector 24. The data portions A and B, or data C and D from the memory blocks 20A to 20D, which total a 16-bit word length, are allowed to pass through the selector 24.

Finally, when the control signal from the enable line EN 32 alone is at logic level "H", all of the OR gates 234A to 234D respectively supply the select signals SA to SD to the 2-way gates 24A to 24D of the selector 24. Then, the 2-way gates 24A to 24D parallel-output the 8-bit data A, B, C and D supplied to their respective first input/output ports from their respective second input/output ports. Accordingly, irrespective of the signal from the address line A3 or A4, the select signals SA to SD are supplied to the 2-way gates 24A to 24D of the selector 24, and all of the data A, B, C and D from the memory blocks 20A to 20D, which total a 32-bit word length, are allowed to pass through the selector 24.

In a write operation, the data is supplied to the second input/output ports of the 2-way gates 24A to 24D of the selector 24, passes through selector 24, and is then supplied to at least one of the memory blocks 20A to 20D.

Figure 3:
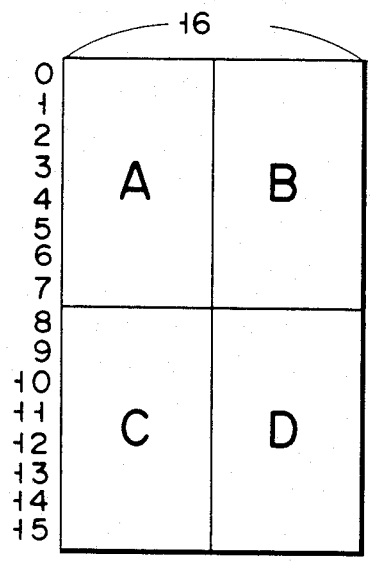
FIG. 3 shows general registers constituted of the circuits shown in FIG. 2.
Figure 5:
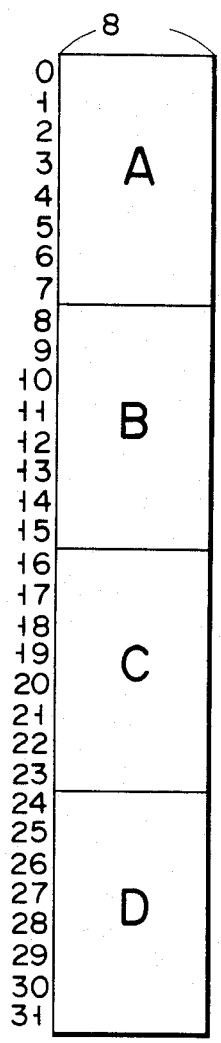
FIG. 5 shows scratch pad memories constituted of the circuits shown in FIG. 2.
Figure 4:
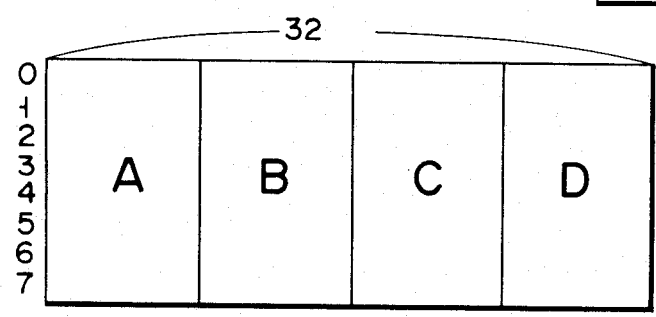
FIG. 4 shows floating registers constituted of the circuits shown in FIG. 2.

The circuits of the memory section 10 having a configuration as described above may be used to build general registers, floating registers, and scratch pad memories of the combinations as shown in FIGS. 3 to 5 by connecting through the enable lines EN8, EN16 and EN32 and setting the logic levels of the control signals.

In the semiconductor device according to the embodiment of the present invention, the memory section 10 has a special circuit element configuration for a memory and has a small interval between the respective circuit elements. Accordingly, the memory section occupies a smaller area on the chip than does a memory of the comparable capacity. Furthermore, the memory speed is faster than that of a memory obtained by connecting arrayed gates. Since the memory blocks, decoders and selector are completely connected, the memory configuration may be determined by simple connection of the enable lines EN8, EN16 and EN32. When the control signals are supplied from the circuits of the array section to the selector controlling circuit through the enable lines EN8, EN16 and EN32, the memory configuration may be changed during the operation of the LSI.

When the word passed through the selector 24 has a word length of 16 bits or 8 bits, a circuit for aligning the LSBs may be added to the selector 24 so as to allow use of a common data line.

In the embodiment described above, each memory block has an 8-bit × 8-word configuration. However, the word length and word number may be changed arbitrarily (m bit × n word, m = 1, 2, ..., n = 1, 2, ...). For example, if each memory block has a 12-bit × 6-word memory, a memory configuration for four such memory blocks may be selected from 12-bit × 24-word, 24-bit × 12-word, and 48-bit × 6-word blocks. However, note that the input/output bit number of the decoder and the port size of the selector and the like, must be changed accordingly.

The memory reliability may be further improved if each memory block has a parity memory cell for each word, and the memory section has a parity generating circuit and a parity check circuit.

In summary, according to a semiconductor device of the present invention, the memories are highly integrated and are formed on the chip besides the arrayed gates. Accordingly, the memory of the present invention occupies a smaller area on a chip than does a memory of the same capacity consisting of arrayed gates. The semiconductor device of the present invention thus has a wide area of applications. Furthermore, even when the arrangement and connection of the circuit elements of a memory section of a semiconductor device of the present invention are completed, selection of a bit×word configuration may be made from among a predetermined number of combinations. The memory design of custom-circuit LSIs may be simplified and development time and cost may be reduced.

In the memory section of the semiconductor device of the embodiment described above, semiconductor elements corresponding to decoders, memory blocks, and a selector necessary for the memory circuit is connected with a dedicated metal pattern. To form a custom-circuit LSI, this metal pattern may be formed on the semiconductor elements in the memory section by using only one single glass mask. This decreases the number of manufacturing steps.

What is claimed is:

1. A logic array device on a semiconductor chip comprising:
   a predetermined number of memory blocks each including a plurality of word memories;
   selecting means, including a control port for receiving a first signal, for selecting at least one of said memory blocks to be accessed based on said first signal, the number of selected memory blocks determing a word length of write-in and read-out data;
   decoding means, including an input port for receiving a second signal, for selectively actuating one of said word memories to be accessed in each of said selected memory blocks based on said second signal; and
   transfer means for transferring the wire-in data to or read-out data from each said work memory actuated by said decoding means in each of said selected blocks, thereby providing a read and write memory with a variable word length.

2. A logic array device according to claim 1, wherein the number of said memory blocks is four.

3. A lgoic array device according to claim 2, wherein said memory blocks each includes 8 word memories.

4. A logic array device according to claim 3, wherein said word memories are of 8-bits.

5. A lgoic array device accoding to claim 1, further comprising a plurality of logic gate cells which are interconnected to form a custom-circuit logic function.

6. A logic array device according to claim 5, wherein said logic cells are NOR gates.

7. A logic array device according to claim 5, wherein said logic gate cells are NAND gates.

8. A logic device for selectively accessing data of varying word length comprising;
   memory means, including a plurality of memory blocks, each said memory block including a plurality of memory cells, each at a predetermined address therein;
   means for determining an address of memory cells to be accessed;
   means for determining at least one of said memory blocks which is to be accessed, each of said accessed memory blacks then accessed using said address from said determining means, the number of memory blocks being accessed determining the word length; and
   means for accessing data contained in said accessed memory cells located in said at least one accessed memory blocks, thereby accessing data which has a word length which is a multiple of the word length of each said memory cell.

9. A semiconductor memory device comprising:
   a plurality of memory blocks each of which includes a plurality of basic memories of a predetermined word length;
   actuating means for selectively actuating one of the basic memories of each block;
   word-length control means for combining the actuated memory blocks to form at least one block group and for selectively designating one block group; and
   a plurality of transfer means, each connected to the basic memories of a different one of said memory blocks, for transferring data to and from the actuated basic memories of the block group designated by said word-length control means.

10. A semiconductor memory device according to claim 9, wherein said word-length control means includes grouping means for dividing the memory blocks into groups, each group consisting of a same number of blocks, and designating means for selectively designating one of the block groups.

11. A semiconductor memory device according to claim 10, wherein said word-length control means has a first input port for receiving a mode preset signal and a second input port for receiving an address signal, said grouping means being connectcd to said first input port to determine a number of memory blocks forming each block group in accordance with the mode preset signal, and said designating means being connected to said second input port to selectively designate one of the block groups in accordance with the address signal.

12. A semiconductor memory device according to claim 11, wherein said actuating means includes decoder means for decoding a second address signal.

13. A semiconductor memory device according to claim 12, wherein the number of said memory blocks is four, and each of said memory blocks includes 8-bit basic memories.

14. A semiconductor memory device according to claim 13, further comprising a plurality of logic gate cells, interconnected to form a custom logic function circuit.

15. A semiconductor memory device according to claim 14, wherein said custom logic function circuit includes signal generator means for generating said mode preset signal.

16. A semiconductor memory device according to claim 14, wherein said logic gate cells are NOR gates.

17. A semiconductor memory device according to claim 14, wherein said logic gate cells are NAND gates.

18. A semiconductor memory device comprising:
   memory means, including 4 memory blocks each of which has basic memories of 8-bit word length;

first decoder means for decoding a first address signal to actuate one of the basic memories of each memory block;

grouping means, connected to receive one of first to third enable signals, for combining the memory blocks to form a corresponding one of: (a) a single group consisting of 4 memory blocks, (b) 2 groups each consisting of 2 memory blocks, and (c) 4 groups each consisting of a single memory block;

second decoder means for decoding a second address signal to designate one of the block groups formed by the grouping means; and transfer means having 4 transfer sections, each of which is connected to the basic memories of a different one of said memory blocks, for transferring data to and from the actuated basic memories of the block group designated by said second decoder means.

* * * * *